(12) United States Patent
Jeon

(10) Patent No.: US 6,201,727 B1
(45) Date of Patent: Mar. 13, 2001

(54) NONVOLATILE FERROELECTRIC RANDOM ACCESS MEMORY DEVICE WITH SEGMENTED PLATE LINE SCHEME AND A METHOD FOR DRIVING A PLATE LINE SEGMENT THEREIN

(75) Inventor: Byung-Gil Jeon, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/591,810

(22) Filed: Jun. 12, 2000

(30) Foreign Application Priority Data

Jun. 10, 1999 (KR) .................................................. 99-21525

(51) Int. Cl.[7] .................................................. G11C 11/22
(52) U.S. Cl. ...................................... 365/145; 365/230.03
(58) Field of Search .............................. 365/145, 189.09, 365/230.03, 129, 189.01, 230.01

(56) References Cited

U.S. PATENT DOCUMENTS

| 5,373,463 | * | 12/1994 | Jones, Jr. | .............................. 365/145 |
| 5,598,366 | * | 1/1997 | Kraus et al. | ........................ 365/145 |
| 5,798,964 | * | 8/1998 | Shimizu et al. | ..................... 365/145 |

\* cited by examiner

*Primary Examiner*—David Nelms
*Assistant Examiner*—Hoai V. Ho
(74) *Attorney, Agent, or Firm*—Marger Johnson & McCollom, P.C.

(57) ABSTRACT

Disclosed herein is a ferroelectric random access memory device that includes a word line, a plate line corresponding to the word line, a plurality of bit lines, and a plurality of memory cells arranged at intersections of the word line and the bit lines. A first NMOS transistor couples and decouples one end of the plate line to the word line responsive to a first switch control signal. A second NMOS transistor couples or decouples the other end of the plate line to a reference voltage responsive to a second switch control signal.

17 Claims, 2 Drawing Sheets

NONVOLATILE FERROELECTRIC RANDOM ACCESS MEMORY DEVICE WITH SEGMENTED PLATE LINE SCHEME AND A METHOD FOR DRIVING A PLATE LINE SEGMENT THEREIN

FIELD OF THE INVENTION

The present invention relates to random access memory devices and, more particularly, to a nonvolatile ferroelectric random access memory device with a segmented plate line and a method for driving a plate line segment therein.

BACKGROUND OF THE INVENTION

A ferroelectric random access memory uses a ferroelectric capacitor as the storage element for each memory cell. Each memory cell stores a logic state based on the electrical polarization of the ferroelectric capacitor. The ferroelectric capacitor has a dielectric between its plates (or electrodes) that comprises a ferroelectric material such as lead zirconate titanate (PZT). When a voltage is applied to the plates of the ferroelectric capacitor, the ferroelectric material is polarized in the direction of the electric field. The switching threshold for changing the polarization state of the ferroelectric capacitor is defined as the coercive voltage. One plate of the ferroelectric capacitor is coupled to a bit line via an access transistor and the other plate is coupled to a plate line (or drive line) as disclosed in U.S. Pat. No. 5,751,626, entitled "FERROELECTRIC MEMORY USING FERROELECTRIC REFERENCE CELLS" incorporated herein by reference.

The ferroelectric capacitor exhibits hysteresis. The flow of current to the capacitor depends on its polarization state. If the voltage applied to the capacitor is greater than its coercive voltage, then the ferroelectric capacitor may change the polarization state depending on the polarity of the applied voltage. The polarization state is retained after power is removed resulting in nonvolatility. The ferroelectric capacitor can be switched between polarization states in about one nanosecond, which is faster than the programming time of most other nonvolatile memories such as Erasable Programmable Read Only Memories (EPROMs), Electrically Erasable Programmable Read Only Memories (EEPROMs) or flash EEPROMs.

In order to read or write data from or to a memory cell, respectively, the plate line is driven such that a voltage difference between the plates of the ferroelectric capacitor is applied. Circuits for driving plate lines are disclosed in U.S. Pat. No. 5,592,410, entitled "CIRCUIT AND METHOD FOR REDUCING A COMPENSATION OF A FERROELECTRIC CAPACITOR BY MULTIPLE PULSING OF THE PLATE LINE FOLLOWING A WRITE OPERATION" and U.S. Pat. No. 5,086,412, entitled "SENSE AMPLIFIER AND METHOD FOR FERROELECTRIC MEMORY," which are hereby incorporated by reference. Both of these U.S. patents disclose an array of memory cells and a decoder that is coupled to the array via a plurality of word lines and a plurality of plate lines corresponding to the word lines, respectively. According to the decoding structure of the above-described patents, a word and a plate line are simultaneously selected and driven by the decoder. However, the above described decoding structure is inapt to the high density memory device because the number of ferroelectric capacitors commonly coupled to a plate line is limited owing to the high RC delay of the plate line.

One solution to the above-mentioned problem is termed "segmented plate line" structure. The segmented plate line structure is disclosed in U.S. Pat. No. 5,598,366, entitled "FERROELECTRIC NONVOLATILE RANDOM ACCESS MEMORY UTILIZING SELF-BOOSTING PLATE LINE SEGMENT DRIVERS" and U.S. Pat. No. 5,373,463, entitled "FERROELECTRIC NONVOLATILE RANDOM ACCESS MEMORY HAVING DRIVE LINE SEGMENTS," which are hereby incorporated by reference.

According to the segmented plate line structure disclosed in the '366 and '463 patents, changes in the polarization state of memory cells coupled to inactive plate line segments are eliminated, reducing fatigue and extending the useful operating life of the memory device. Additionally, the segmented plate line structure reduces total power consumption of the memory array and the time required to transition a plate line segment when compared to a non-segmented plate line.

In the segmented plate line structure, deselected plate line segments are floated during a write/read operation. Because of this they are exposed to peripheral noise and signal coupling. That is, the deselected plate line segments are electrically coupled to selected bit lines and to a selected plate line segment. Therefore, the polarization direction of the ferroelectric capacitors coupled to the deselected plate line segments may be changed during the read/write cycle associated with the selected plate line segment. This coupling causes the reduction of the sensing margin and the destruction of data that is stored in the ferroelectric capacitors coupled to the deselected plate line segments.

SUMMARY OF THE INVENTION

It is therefore an object of the present invention to provide a nonvolatile ferroelectric random access memory device having a segmented plate line structure that is capable of preventing deselected plate line segments from floating during a read/write cycle and to provide a method for driving a plate line segment therein.

In order to attain the above objects, according to an aspect of the present invention, there is provided a ferroelectric random access memory device that comprises a word line arranged in a first direction, a plate line arranged in the first direction, a plurality of bit lines arranged in a second direction perpendicular to the first direction, and a plurality of memory cells each arranged at an intersection of the word line and a cororesponding bit line. A first and a second switch circuit are further provided. The first switch circuit couples one end of the plate line to the word line responsive to a first switch control signal. The first switch circuit comprises an NMOS transistor having a gate for receiving the first switch control signal and a current path formed between the word line and the plate line. The second switch circuit couples the other end of the plate line to a reference voltage responsive to a second switch control signal. The second switch circuit comrprises an NMOS transistor having a gate for receiving the second switch control signal and a current path formed between the plate line and the reference voltage.

According to the present invention, the ferroelectric random access memory device further comprises a second plurality of bit lines arranged in the second direction, a second plate line arranged in the first direction and isolated from the first plate line, and a second plurality of memory cells, each memory cell of the second plurality of memory cells being at an intersection of the word line and a corresponding second bit line, a third switch circuit for coupling one end of the second plate line to the word line responsive to a third switch control signal, and a fourth switch circuit for coupling the other end of the second plate line to the ground voltage responsive to a fourth switch control signal.

The third switch control signal comprises a third NMOS transistor having a gate for receiving the third switch control signal and a current path formed between the word line and the second plate line. The fourth switch circuit comprises of a fourth NMOS transistor having a gate for receiving the fourth switch control signal and a current path formed between the second plate line and the ground voltage.

According to another aspect of this invention, there is provided a method for driving a plate line in a ferroelectric random access memory device, the ferroelectric random access memory having a memory cell array including a word line arranged in a row direction, a plate line arranged in the row direction, a plurality of bit lines arranged in a column direction, and a plurality of memory cells, each memory cell arranged respectively at the intersection of the word line and a corresponding bit line. The method comprises charging the plate line with a reference voltage, decoupling the plate line from the reference voltage, coupling the word line and the plate line after decoupling the plate line, and activating the word line so that the plate line has a plate line voltage.

BRIEF DESCRIPTION OF THE DRAWINGS

The foregoing and other objects, features, and advantages of the invention will become more readily apparent from the following detailed description of a preferred embodiment that proceeds with reference to the following drawings.

DESCRIPTION OF THE PREFERRED EMBODIMENT

Figure 1:
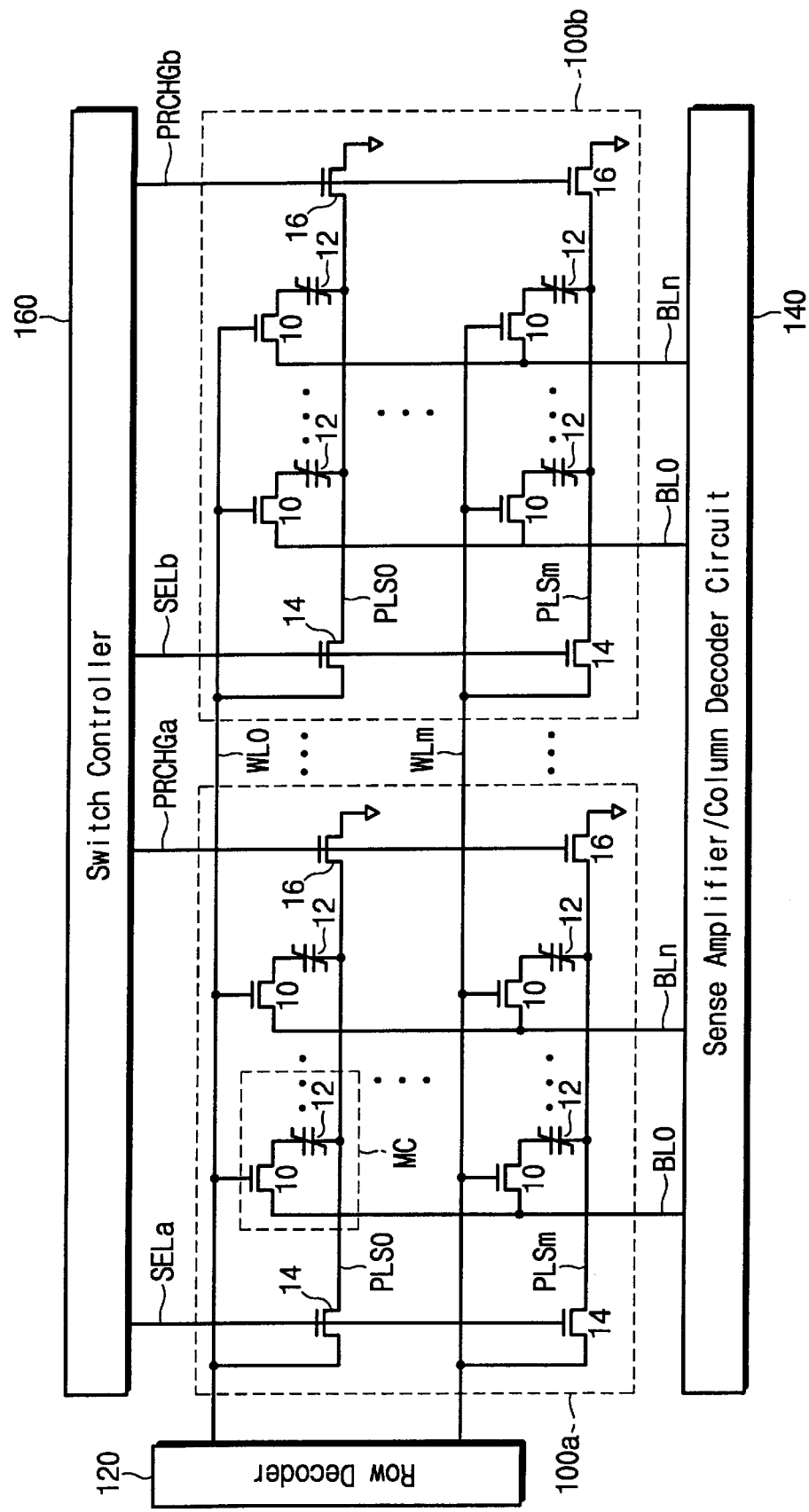
FIG. 1 is a block diagram of a nonvolatile ferroelectric random access memory device according to the present invention.

A preferred embodiment of the present invention will be more fully described with reference to the accompanying drawings. FIG. 1 is a diagram showing a nonvolatile ferroelectric random access memory (NVFRAM) device according to the present invention. The NVFRAM device according to the present invention includes a segmented plate line scheme (or local plate line scheme) that eliminates changes in the polarization state of memory cells coupled to inactive plate line segments to thereby reduce fatigue and extend the useful operating life of the memory. Additionally, the segmented plate line structure reduces total power consumption of the memory array and the time required to transition a plate line segment when compared to a non-segmented plate line.

Referring to FIG. 1, the NVFRAM device of the present invention comprises a memory cell array that stores data information and is divided into a plurality of memory blocks 100a through 100b. A plurality of word lines WLi (i=0–m) are arranged in parallel in a row direction and extend via the memory blocks 100a and 100b. Each of the memory blocks 100a through 100b has a plurality of plate line segments PLSi (or local plate lines) arranged in parallel in the row direction and a plurality of bit lines BLj (j=0–n) arranged in parallel in a column direction. The plurality of plate line segments PLSi in the respective memory blocks 100a through 100b correspond to the word lines WLi.

In the respective memory blocks 100a through 100b, a plurality of memory cells MC are further provided that have an access transistor 10 and a ferroelectric capacitor 12, respectively. The access transistor 10 of each memory cell in a row has a gate coupled to a word line WLi corresponding to that row. The ferroelectric capacitor 12 has one plate coupled to a corresponding bit line BLj via a corresponding access transistor 10 and another plate coupled to a corresponding plate line segment PLSi.

As illustrated in FIG. 1, one end of a plate line segment PLSi is connected to a corresponding word line WLi through NMOS transistor 14. NMOS transistor 16 performs a switching operation responsive to a corresponding switch control signal SELa or SELb from a switch controller 160. The other end of the plate line segment PLSi therein is connected to a reference voltage (for example, a ground voltage) through NMOS transistor 16. NMOS transistor 16 performs a switching operation responsive to a corresponding switch control signal PRCHGa or PRCHGb from the switch controller 160.

For example, a plate line segment PLS0 in the memory block 100a is coupled to a corresponding word line WL0 through the NMOS transistor 14. NMOS transistor 14 is turned on responsive to the switch control signal SELa having a logic high level. Alternatively, a plate line segment PLS0 is coupled to the ground voltage through the NMOS transistor 16 that is turned on responsive to the switch control signal PRCHGa having a logic high level. A plate line segment PLS0 in memory block 100b is coupled to the word line WL0 through the NMOS transistor 14 that is turned on responsive to the switch control signal SELb having a logic high level. Alternatively, the plate line segment PLS0 of memory block 100b is coupled to the ground voltage through the NMOS transistor 16 that is turned on responsive to the switch control signal PRCHGb having a logic high level. Other plate line segments PLS1 through PLSm in the memory blocks 100a through 100b are coupled to the corresponding word lines WL1 through WLm or to the ground voltage in the same manner as above described.

Continuing to refer to FIG. 1, the word lines WL0 through WLm are coupled to a row decoder 120, which selects and drives one of the word lines WL0 through WLm responsive to a row address. The bit lines BL0 through BLn of the respective memory blocks 100a through 100b are coupled to a sense amplifier/column decoder circuit 140, which comprises column decoders and sense amplifiers for each bit line BLj of the respective memory blocks 100a through 100b. A column decoder selects a corresponding bit line responsive to a column address. A sense amplifier detects and amplifies a signal on a corresponding bit line and provides a corresponding output data signal during a read cycle. During a write cycle, the sense amplifiers are used as drivers for writing either a logic one or a logic zero into memory cells through corresponding bit lines.

Figure 2:
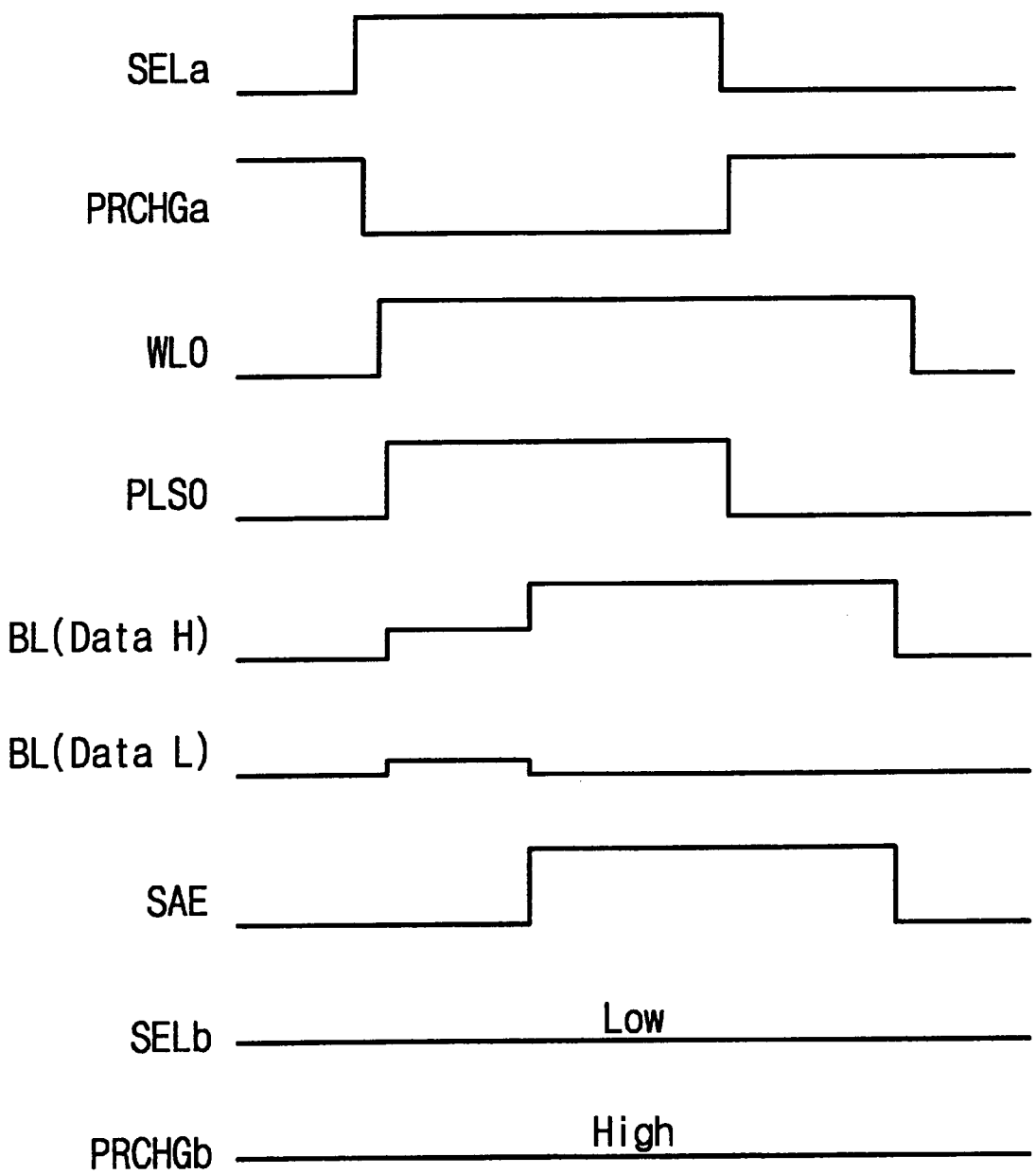
FIG. 2 a timing diagram of the control signals used in FIG. 1.

FIG. 2 is a timing diagram of the control signals used in FIG. 1. A read operation of the NVFRAM device according to the present invention will be more fully described below with reference to the accompanying drawings. In the case where data is read out from a memory block 100a, for example, the switch control signal SELb of the memory block 100b is maintained low and the switch control signal PRCHGb thereof is maintained high. Under these conditions, the NMOS transistors 14 of the memory block 100b are turned off and the NMOS transistors 16 are turned on. This enables the word lines WLi to be separated (isolated) from the corresponding plate line segments PLSi of the memory block 100b and the plate line segments PLSi of the memory block 100b to be grounded. Similarly, the plate line segments PLSi of other deselected memory blocks are grounded under the disconnection from the corresponding word lines WLi in the same manner as above described.

As illustrated in FIG. 2, when the memory block 100a is selected, the switch control signal PRCHGa transitions from a logic high level to a logic low level. This enables the NMOS transistors 16 of the selected memory block 100a to be turned off, so that the plate line segments PLSi are isolated from the ground voltage. Furthermore, when the memory block 100a is selected, the switch control signal SELa transitions from a logic low level to a logic high level. This enables the NMOS transistors 14 of the selected memory block 100a to be turned on, so that the plate line segments PLSi are connected to the corresponding word lines WLi having a ground voltage level through the corresponding NMOS transistors 14, respectively. Therefore, the plate line segments PLS0 through PLSm of the selected memory block 100a are maintained at the ground voltage level.

When a selected word line, for example, WL0 turns to a logic high level, a plate line segment PLS0 corresponding to the selected word line WL0 is also driven through the NMOS transistor 14 at a voltage greater than a coercive voltage. Since a voltage difference between both plates of the respective ferroelectric capacitors 12 coupled commonly to the plate line segment PLS0 is created, each of the ferroelectric capacitors 12 is switched or not switched according to its polarization state. At this time, voltages on the bit lines BL0 through BLn provided in the selected memory block 100a change. For example, a voltage on a bit line coupled to a memory cell MC of storing data having a logic one becomes higher than that of a bit line coupled to a memory cell MC storing data having a logic zero.

As shown in FIG. 2, when a sense amplifier enable signal SAE transitions from a logic low level to a logic high level, the voltages on the bit lines BL0 through BLn are amplified at a power supply voltage or at a ground voltage through the corresponding sense amplifiers. As predetermined ones of the bit lines BL0 through BLn are selected by the column decoder circuit 140, the voltages on the selected bit lines are transferred as output data. After a predetermined time lapses, the plate line segments PLSi are separated from the corresponding word lines WLi when the switch control signal SELa transitions from a logic high level to a logic low level. When the switch control signal PRCHGa transitions from a logic low level to a logic high level, the plate line segments PLSi are grounded via corresponding NMOS transistors 16. At this time, a write-back operation for the memory cells MC of the memory block 100a coupled to the selected word line WL0 is performed. The above described read operation ends by deactivating the selected word line WL0 and the sense amplifier enable signal SAE as shown in FIG. 2.

A first advantageous effect of the nonvolatile ferroelectric random access memory device with the segmented plate line structure according to the present invention is that the chip area occupied by the row decoder 120 can be considerably reduced as compared with that configured in accordance with the '410 and '412 patents set forth above. Accordingly, the layout efficiency of the nonvolatile ferroelectric random access memory device according to the present invention is improved.

A second advantageous effect of the present invention is that the voltage level on a selected plate line segment can be adjusted freely by controlling the voltage level of switch control signals SELa through SELb. The adjustability results in a sensing margin that can be improved by freely adjusting the voltage difference between both plates of a ferroelectric capacitor.

A third advantageous effect of the present invention is that deselected plate line segments are prevented from floating during a write/read cycle. In particular, in the case of a selected memory block, deselected plate line segments are coupled to deselected word lines, each having a ground voltage, via NMOS transistors 14 that are switched on by a switch control signal SEL having a logic high level. In case of deselected memory blocks, all plate line segments PLSi of each memory block are grounded via the NMOS transistors 16 that are also switched on by a switch control signal PRCHG. Therefore, remaining plate line segments except for a selected plate line segment are not exposed at peripheral noise and signal coupling during a read/write cycle. This means that the polarization directions of the respective ferroelectric capacitors coupled to the remaining plate line segments are maintained constant and stable. As a result, the reliability of the NVFRAM device according to the present invention is improved.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A random access memory device comprising:
   a word line arranged in a first direction;
   a plate line arranged in the first direction;
   a plurality of bit lines arranged in a second direction perpendicular to the first direction;
   a plurality of memory cells, each memory cell is arranged at an intersection of the word line and a corresponding bit line;
   a first switch circuit for coupling one end of the plate line to the word line responsive to a first switch control signal; and
   a second switch circuit for coupling the other end of the plate line to a reference voltage responsive to a second switch control signal.

2. The random access memory device according to claim 1 wherein each of the memory cells comprises an access transistor having a gate coupled to the word line and a ferroelectric capacitor having a first plate coupled to a corresponding bit line via the access transistor and a second plate coupled to the plate line.

3. The random access memory device according to claim 2 wherein the first switch circuit comprises a first NMOS transistor having a gate for receiving the first switch control signal and a current path formed between the word line and the plate line.

4. The random access memory device according to claim 3 wherein the second switch circuit comprises a second NMOS transistor having a gate for receiving the second switch control signal and a current path formed between the plate line and the reference voltage.

5. The random access memory device according to claim 4 wherein the reference voltage is a ground voltage.

6. The random access memory device according to claim 1, comprising:
   a second plurality of bit lines arranged in the second direction;
   a second plate line arranged in the first direction and isolated from the first plate line;
   a second plurality of memory cells arranged at an intersection of the word line and a corresponding bit line of the second plurality of bit lines;

a third switch circuit for coupling one end of the second plate line to the word line responsive to a third switch control signal; and a fourth switch circuit for coupling the other end of the second plate line to the reference voltage responsive to a fourth switch control signal.

7. The random access memory device according to claim 6 wherein the third switch circuit comprises a third NMOS transistor having a gate for receiving the third switch control signal and a current path formed between the word line and the second plate line and wherein the fourth switch circuit comprises a fourth NMOS transistor having a gate for receiving the fourth switch control signal and a current path formed between the second plate line and the reference voltage.

8. The random access memory device according to claim 7 wherein when at least one memory cell of the first plurality of memory cells is selected, the first switch control signal is activated and the second switch control signal is deactivated such that the first plate line is connected to the word line and wherein the third switch control signal is deactivated and the fourth switch control signal is activated such that the second plate line is grounded.

9. The random access memory device according to claim 7 wherein when at least one memory cell of the second plurality of memory cells is selected, the first switch control signal is deactivated and the second switch control signal is activated such that the first plate line is grounded and wherein the third switch control signal is activated and the fourth switch control signal is deactivated such that the second plate line is connected to the word line.

10. A random access memory device, comprising:
a memory cell array divided into a plurality of memory blocks;
a plurality of word lines arranged in a first direction through the plurality of memory blocks; and
a row decoder for selecting one of the plurality of word lines,
wherein each of the memory blocks comprises:
a plurality of bit lines arranged in a second direction;
a plurality of plate line segments arranged in the first direction;
a plurality of memory cells arranged at intersections of corresponding word lines and bit lines;
a first plurality of switch transistors corresponding to the plurality of plate line segments, each switch transistor of the first plurality of switch transistors couples one end of a corresponding plate line segment to a corresponding word line responsive to a first switch control signal; and
a second plurality of switch transistors corresponding to the plurality of plate line segments, each switch transistor of the second plurality of switch transistors couples the other end of the corresponding plate line segment to a ground voltage responsive to a second switch control signal.

11. The random access memory device according to claim 10 wherein each of memory cells in the respective memory blocks comprises an access transistor having a gate coupled to a corresponding word line and a ferroelectric capacitor having a first plate coupled to a corresponding bit line via the access transistor and a second plate coupled to a corresponding plate line segment.

12. The random access memory device according to claim 11 wherein each of the first switch transistors comprises a first NMOS transistor having a gate for receiving the first switch control signal and a current path formed between a corresponding word line and a corresponding plate line segment.

13. The random access memory device according to claim 12 wherein each of the second switch transistors comprises of a second NMOS transistor having a gate for receiving the second switch control signal and a current path formed between the corresponding plate line segment and the reference voltage.

14. The random access memory device according to claim 13 wherein when data is read/written from/to, respectively, a selected memory block, the first switch control signal associated with the selected memory block is activated and the second switch control signal associated with the selected memory block is deactivated while the first switch control signal associated with each deselected memory block is deactivated and the second switch control signal associated with each deselected memory block is activated.

15. A method for driving a plate line in a ferroelectric random access memory device, the ferroelectric random access memory device having a memory cell array that comprises a word line arranged in a first direction, a plate line arranged in the first direction, a plurality of bit lines arranged in a second direction, and a plurality of memory cells each memory cell arranged at an intersection of the word line and a corresponding bit line, the method comprising:
charging the plate line with a reference voltage;
decoupling the plate line from the reference voltage;
coupling the word line to the plate line after decoupling the plate line from the reference voltage; and
activating the word line such that the plate line has a plate line voltage.

16. The method according to claim 15 wherein the reference voltage is a ground voltage.

17. The method according to claim 16 comprising:
decoupling the plate line from the word line;
coupling the plate line to the reference voltage; and
deactivating the word line.

* * * * *